(12) United States Patent
Akimoto et al.

(10) Patent No.: US 9,312,457 B2
(45) Date of Patent: Apr. 12, 2016

(54) LIGHT EMITTING DEVICE AND METHOD FOR MANUFACTURING THE SAME

(71) Applicant: KABUSHIKI KAISHA TOSHIBA, Minato-ku, Tokyo (JP)

(72) Inventors: Yosuke Akimoto, Kanagawa-ken (JP); Akihiro Kojima, Kanagawa-ken (JP); Miyoko Shimada, Kanagawa-ken (JP); Hideto Furuyama, Kanagawa-ken (JP); Yoshiaki Sugizaki, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 55 days.

(21) Appl. No.: 13/781,545

(22) Filed: Feb. 28, 2013

(65) Prior Publication Data

US 2013/0240930 A1    Sep. 19, 2013

(30) Foreign Application Priority Data

Mar. 19, 2012  (JP) ................................. 2012-062817

(51) Int. Cl.
*H01L 33/00* (2010.01)
*H01L 33/60* (2010.01)
*H01L 33/48* (2010.01)
*H01L 33/62* (2010.01)
*H01L 33/50* (2010.01)

(52) U.S. Cl.
CPC .............. *H01L 33/60* (2013.01); *H01L 33/005* (2013.01); *H01L 33/486* (2013.01); *H01L 33/62* (2013.01); *H01L 33/505* (2013.01); *H01L 2924/0002* (2013.01)

(58) Field of Classification Search
CPC .............................. H01L 27/156; H01L 33/62
USPC ...................................................... 257/88–99
See application file for complete search history.

(56) References Cited

U.S. PATENT DOCUMENTS

| 6,288,497 | B1 | 9/2001 | Chang et al. |
| 2003/0160258 | A1 | 8/2003 | Oohata |
| 2004/0173810 | A1 | 9/2004 | Lin et al. |
| 2004/0208210 | A1 | 10/2004 | Inoguchi |
| 2004/0259282 | A1 | 12/2004 | Oohata |

(Continued)

FOREIGN PATENT DOCUMENTS

| JP | 2003-168762 A | 6/2003 |
| JP | 2006179862 A | 7/2006 |

(Continued)

OTHER PUBLICATIONS

Japanese Office Action dated Jul. 3, 2014 in counterpart Japanese Application No. 2012-062817.

(Continued)

*Primary Examiner* — Mohsen Ahmadi
*Assistant Examiner* — Frederick B Hargrove
(74) *Attorney, Agent, or Firm* — Holtz, Holtz & Volek PC

(57) ABSTRACT

According to one embodiment, a light emitting device includes a first base section, a light emitting section, and a first wiring section. The light emitting section is embedded on a first surface side of the first base section. The light emitting section includes a light emitting element. The first wiring section is provided on the first surface of the first base section. The first wiring section is connected to the light emitting element.

17 Claims, 10 Drawing Sheets

(56) References Cited

U.S. PATENT DOCUMENTS

| | | |
|---|---|---|
| 2005/0186763 A1 | 8/2005 | Oohata |
| 2006/0091403 A1* | 5/2006 | Chang et al. .................... 257/79 |
| 2006/0132578 A1 | 6/2006 | Tu et al. |
| 2008/0142946 A1 | 6/2008 | Yang et al. |
| 2008/0179602 A1* | 7/2008 | Negley et al. .................. 257/88 |
| 2008/0248614 A1 | 10/2008 | Yang et al. |
| 2010/0001305 A1 | 1/2010 | Lin et al. |
| 2010/0096965 A1 | 4/2010 | Oyaizu et al. |
| 2010/0148198 A1* | 6/2010 | Sugizaki ................. H01L 33/44 257/98 |
| 2010/0212942 A1 | 8/2010 | Tuan et al. |
| 2011/0147778 A1* | 6/2011 | Ichikawa ........................ 257/98 |
| 2011/0278614 A1* | 11/2011 | Maier-Richter et al. ........ 257/98 |
| 2011/0297986 A1 | 12/2011 | Nishiuchi et al. |
| 2011/0297987 A1 | 12/2011 | Koizumi et al. |
| 2012/0097972 A1* | 4/2012 | Sugizaki et al. ................ 257/76 |
| 2012/0302124 A1* | 11/2012 | Imazu ............................ 445/58 |
| 2013/0037842 A1* | 2/2013 | Yamada ................. H01L 33/60 257/98 |
| 2014/0151739 A1 | 6/2014 | Koizumi et al. |

FOREIGN PATENT DOCUMENTS

| | | |
|---|---|---|
| JP | 2009-099716 A | 5/2009 |
| JP | 2009188207 A | 8/2009 |
| JP | 2009-212171 A | 9/2009 |
| JP | 2010-141176 A | 6/2010 |
| JP | 2010123918 A | 6/2010 |
| JP | 2011009572 A | 1/2011 |
| JP | 2011238802 A | 11/2011 |
| JP | 2011258672 A | 12/2011 |
| JP | 2012054422 A | 3/2012 |
| TW | 480754 B | 3/2002 |
| TW | 200539246 A | 12/2005 |
| TW | 200832644 A | 8/2008 |
| TW | 201001632 A | 1/2010 |
| TW | 201201426 A | 1/2012 |
| WO | 2011093454 A1 | 8/2011 |
| WO | WO 2011093454 A1 * | 8/2011 |

OTHER PUBLICATIONS

Extended European Search Report (EESR) dated Jul. 26, 2013 (in English) in counterpart European Application No. 13156739.8.
Japanese Office Action dated Feb. 6, 2015, issued in counterpart Japanese Application No. 2012-062817.
Japanese Office Action dated Nov. 6, 2014, issued in counterpart Japanese Application No. 2012-062817.
Taiwanese Office Action dated Oct. 29, 2014 in counterpart Taiwanese Application No. 102104571.
Taiwanese Office Action dated May 29, 2015, issued in counterpart Taiwanese Application No. 102104571.

* cited by examiner

LIGHT EMITTING DEVICE AND METHOD FOR MANUFACTURING THE SAME

CROSS-REFERENCE TO RELATED APPLICATIONS

This application is based upon and claims the benefit of priority from Japanese Patent Application No. 2012-062817, filed on Mar. 19, 2012; the entire contents of which are incorporated herein by reference.

FIELD

Embodiments described herein relate generally to a light emitting device and a method for manufacturing the same.

BACKGROUND

For the purpose of downsizing, there is a light emitting device including a chip-like semiconductor light emitting element (hereinafter simply referred to as light emitting element).

Such a light emitting device has been used in various applications such as the light source of an illumination device, the backlight source of an image display device, and the light source of a display device.

Thus, in addition to downsizing, there is demand for the development of a light emitting device capable of improving the volume productivity.

DETAILED DESCRIPTION

Figure 1A:
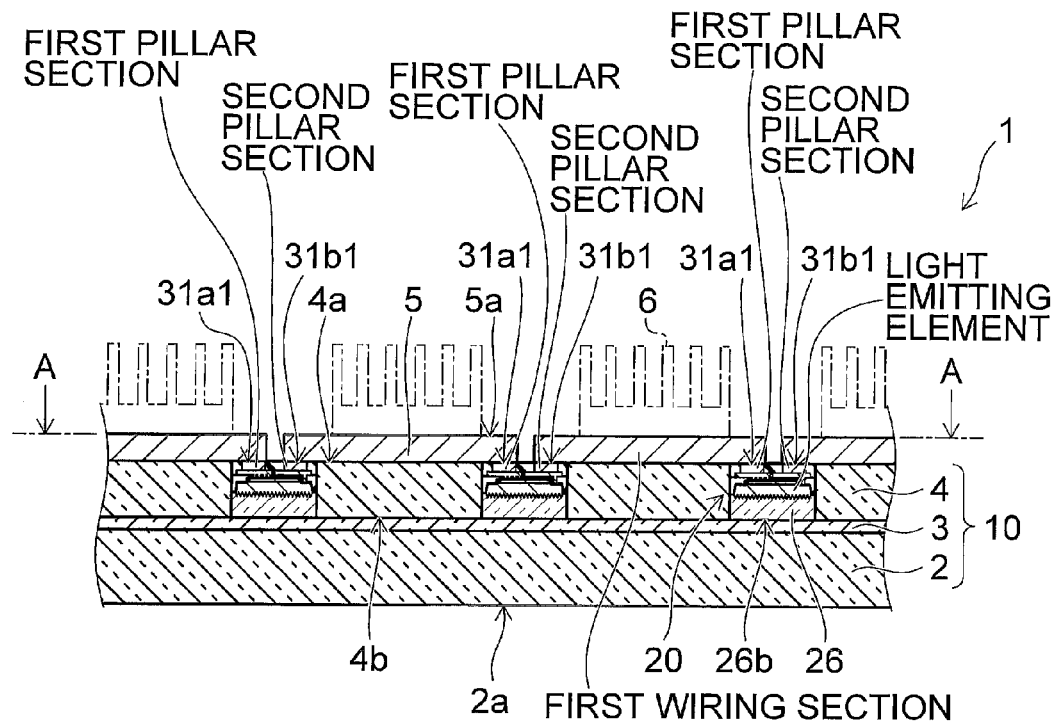
FIGS. 1A and 1B are schematic views illustrating a light emitting device according to a first embodiment.

In general, according to one embodiment, a light emitting device includes a first base section, a light emitting section, and a first wiring section. The light emitting section is embedded on a first surface side of the first base section. The light emitting section includes a light emitting element. The first wiring section is provided on the first surface of the first base section. The first wiring section is connected to the light emitting element.

Embodiments will now be illustrated with reference to the drawings. In the drawings, similar components are labeled with like reference numerals, and the detailed description thereof is omitted appropriately.

[First Embodiment]

Figure 1B:
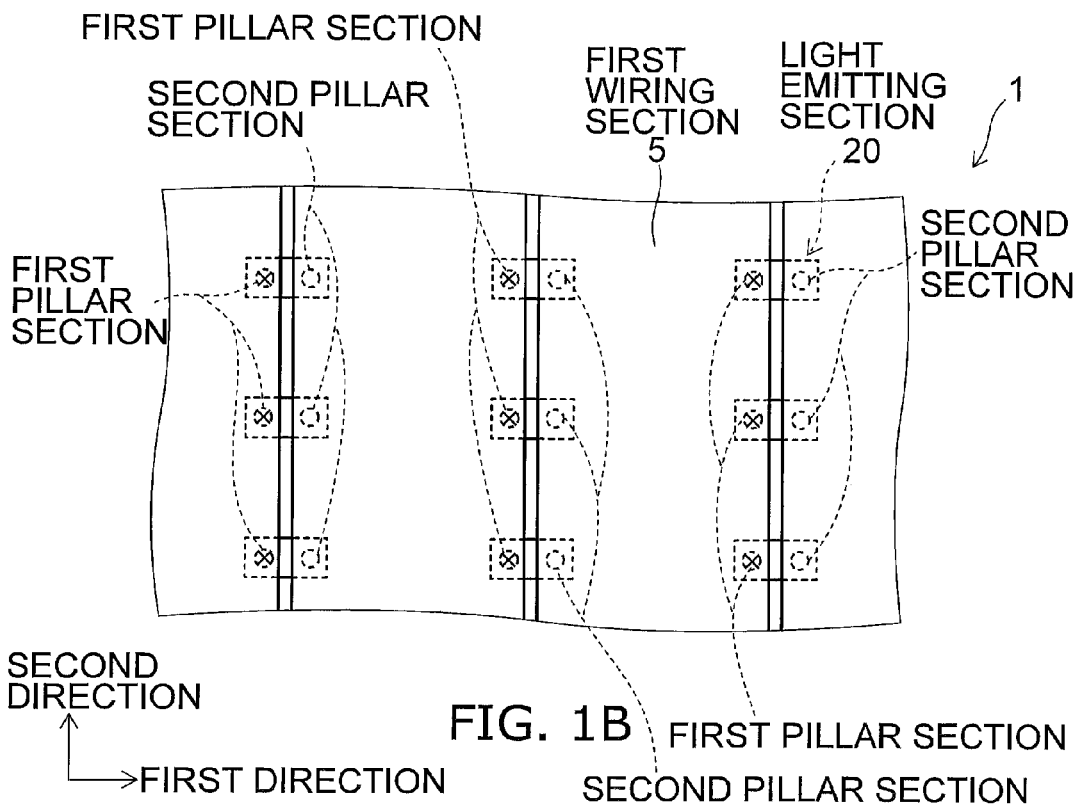

FIGS. 1A and 1B are schematic views illustrating a light emitting device according to a first embodiment. Here, FIG. 1A is a schematic sectional view illustrating the light emitting device. FIG. 1B is an arrow view taken along line A-A in FIG. 1A.

Figure 2:
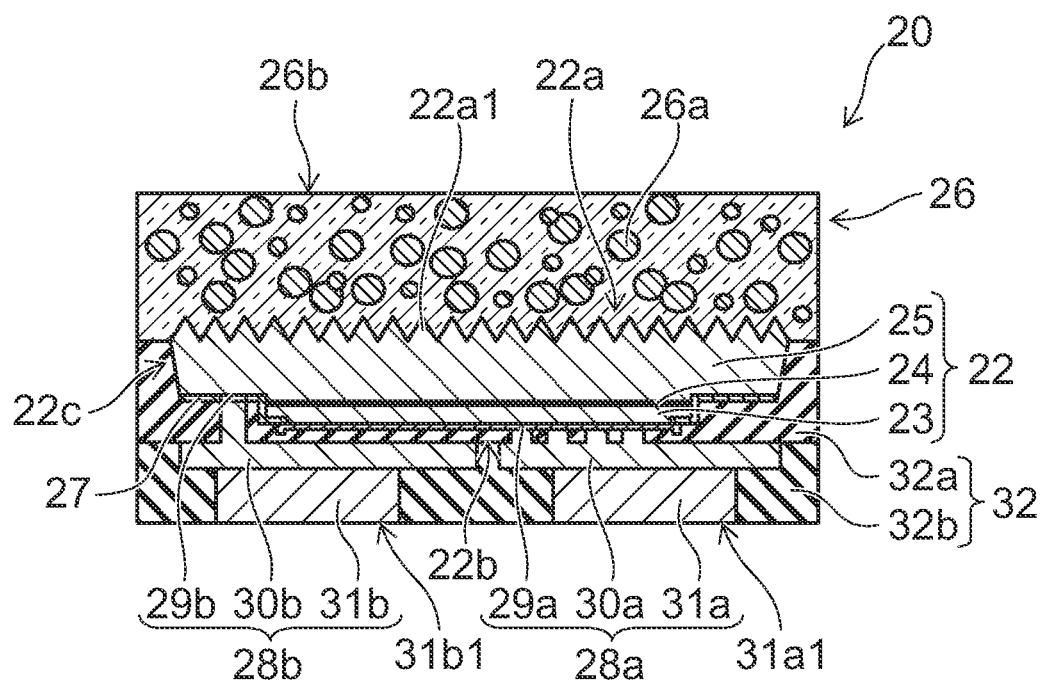
FIG. 2 is a schematic sectional view illustrating a light emitting section.

FIG. 2 is a schematic sectional view illustrating a light emitting section.

As shown in FIGS. 1A and 1B, the light emitting device 1 includes a light emitting section 20, a base section 10 (corresponding to an example of the first base section), and a wiring section 5 (corresponding to an example of the first wiring section).

First, the light emitting section 20 is illustrated.

The light emitting section 20 includes a light emitting element 22. The light emitting section 20 is embedded on the surface 4a (corresponding to an example of the first surface) side of the base section 10 (second base body 4). The light emitting section 20 is embedded with the light emitting surface 26b directed to the opposite side from the surface 4a side of the base section 10. In this case, the surface of the light emitting section 20 on the opposite side from the light emitting surface 26b is located on the same plane as the surface 4a.

As shown in FIG. 2, the light emitting section 20 includes a light emitting element 22, a translucent section 26, an insulating section 27, a first electrode section 28a, a second electrode section 28b, and a sealing section 32.

The light emitting element 22 can be e.g. a light emitting diode.

In this case, the light emitting element 22 includes e.g. a first semiconductor layer 23, a light emitting layer 24 provided on the first semiconductor layer 23, and a second semiconductor layer 25 provided on the light emitting layer 24.

The first semiconductor layer 23 is a layer formed from e.g. a semiconductor doped into p-type (p-type semiconductor).

The light emitting layer 24 has e.g. a quantum well structure composed of a well layer in which holes and electrons are recombined to generate light, and a barrier layer having a larger band gap than the well layer.

The second semiconductor layer 25 is a layer formed from e.g. a semiconductor doped into n-type (n-type semiconductor).

In the case where the light emitting element 22 is a blue light emitting diode that emits blue light, the semiconductor is e.g. a nitride semiconductor.

In this case, the nitride semiconductor is e.g. GaN (gallium nitride), AlN (aluminum nitride), AlGaN (aluminum gallium nitride), or InGaN (indium gallium nitride).

The light emitting surface 22a of the light emitting element 22 is provided with an uneven portion 22a1.

The uneven portion 22a1 scatters the light emitted from the light emitting element 22. This can increase the efficiency of extracting the light generated in the light emitting element 22.

The translucent section 26 is provided on the surface 22a of the light emitting element 22. The translucent section 26 includes a translucent material and a phosphor 26a.

The translucent material is e.g. a translucent resin. The translucent resin is e.g. epoxy resin, silicone resin, methacrylate resin (PMMA), polycarbonate (PC), cyclic polyolefin (COP), alicyclic acrylate (OZ), allyl diglycol carbonate (ADC), acrylate resin, fluororesin, hybrid resin of silicone resin and epoxy resin, or urethane resin.

The phosphor 26a is particulate. The phosphor 26a absorbs part of the light emitted from the light emitting element 22 and emits fluorescence having a prescribed wavelength.

For instance, the phosphor 26a can absorb part of blue light emitted from the light emitting element 22 and emit yellow fluorescence. In this case, for instance, blue light not absorbed by the phosphor 26a and yellow fluorescence emitted from the phosphor 26a are emitted from the translucent section 26.

It is possible to use one kind of phosphor. Alternatively, it is also possible to use a plurality of kinds of phosphor in combination.

For instance, for blue light emitted from the light emitting element 22, it is possible to use only a phosphor emitting yellow fluorescence. Alternatively, for blue light emitted from the light emitting element 22, it is also possible to use a phosphor emitting red fluorescence and a phosphor emitting green fluorescence in combination. In this case, blue light, red light, and green light are emitted from the translucent section 26.

Examples of the material of the phosphor emitting yellow fluorescence can include the following. However, the phosphor emitting yellow fluorescence is not limited thereto, but can be appropriately modified.

$Li(Eu,Sm)W_2O_8$,
$(Y,Gd)_3(Al,Ga)_5O_{12}:Ce^{3+}$,
$Li_2SrSiO_4:Eu^{2+}$,
$(Sr(Ca,Ba))_3SiO_5:Eu^{2+}$,
$SrSi_2ON_{2.7}:Eu^{2+}$

Examples of the material of the phosphor emitting red fluorescence can include the following. However, the phosphor emitting red fluorescence is not limited thereto, but can be appropriately modified.

$La_2O_2S:Eu,Sm$,
$LaSi_3N_5:Eu^{2+}$,
$\alpha$-sialon:$Eu^{2+}$,
$CaAlSiN_3:Eu^{2+}$,
$(SrCa)AlSiN_3:Eu^{x+}$,
$Sr_x(Si_yAl_3)_z(O_xN):Eu^{x+}$ Examples of the material of the phosphor emitting green fluorescence can include the following. However, the phosphor emitting green fluorescence is not limited thereto, but can be appropriately modified.

$(Ba,Sr,Mg)O.aAl_2O_3:Mn$,
$(BrSr)SiO_4:Eu$,
$\alpha$-sialon:$Yb^{2+}$,
$\beta$-sialon:$Eu^{2+}$,
$(CaSr)Si_2O_4N_7:Eu^{2+}$,
$Sr(SiAl)(ON):Ce$ The kind and combination of the colors of fluorescence emitted by the phosphor are not limited to those illustrated, but can be appropriately modified depending on the purpose and the like of the light emitting device 1.

The phosphor 26a is not necessarily needed, but can be appropriately provided depending on the purpose and the like of the light emitting device 1. In the case where the phosphor 26a is not provided, the light emitted from the light emitting element 22 is emitted via the translucent section 26.

The insulating section 27 is provided so as to cover the surface 22b on the opposite side from the light emitting side of the light emitting element 22.

The insulating section 27 can be formed from e.g. $SiO_2$ (silicon oxide).

The first electrode section 28a includes e.g. a first seed section 29a, a first electrode wiring 30a, and a first pillar section 31a.

The second electrode section 28b includes e.g. a second seed section 29b, a second electrode wiring 30b, and a second pillar section 31b.

An electrode, not shown, provided on the surface of the first semiconductor layer 23 is connected to the first pillar section 31a via the first seed section 29a and the first electrode wiring 30a. An electrode, not shown, provided on the surface of the second semiconductor layer 25 is connected to the second pillar section 31b via the second seed section 29b and the second electrode wiring 30b.

That is, the first electrode section 28a is an extraction electrode connected to the electrode, not shown, provided on the first semiconductor layer 23. The second electrode section 28b is an extraction electrode connected to the electrode, not shown, provided on the second semiconductor layer 25.

The first seed section 29a, the first electrode wiring 30a, the first pillar section 31a, the second seed section 29b, the second electrode wiring 30b, and the second pillar section 31b can be formed from e.g. a metal such as copper, gold, nickel, and silver. In this case, in view of e.g. thermal conductivity, migration resistance, and adhesiveness to the sealing section 32, these sections are preferably formed from copper.

The sealing section 32 includes a first sealing section 32a and a second sealing section 32b.

The first sealing section 32a is provided so as to cover the surface 22b side and the side surface 22c side of the light emitting element 22.

The second sealing section 32b is provided so as to cover the first electrode wiring 30a, the first pillar section 31a, the second electrode wiring 30b, and the second pillar section 31b.

However, the end surface 31a1 of the first pillar section 31a and the end surface 31b1 of the second pillar section 31b are exposed from the second sealing section 32b.

The first sealing section 32a and the second sealing section 32b can be formed from e.g. an organic material or inorganic material having insulating property. In this case, the first sealing section 32a, the second sealing section 32b, and the insulating section 27 can be integrally formed.

The thickness of the first pillar section 31a, the second pillar section 31b, and the second sealing section 32b can be thickened. Then, even if the thickness of the light emitting element 22 is thin, the decrease of mechanical strength of the light emitting element 22 can be compensated.

Next, returning to FIGS. 1A and 1B, the base section 10 and the wiring section 5 are illustrated.

The base section 10 includes a first base body 2, a bonding section 3 (corresponding to an example of the first bonding section), and a second base body 4.

The first base body 2 is plate-like and translucent. The surface 2a of the first base body 2 can be provided with an uneven portion, not shown, or a diffusing layer (e.g., a layer made of resin containing fine particles), not shown, for diffusing the emitted light.

The first base body 2 can be formed from e.g. a translucent material. The translucent material is e.g. an organic material such as translucent resin, or an inorganic material such as glass. For instance, the translucent resin can be made similar to that illustrated in the translucent section 26.

The bonding section 3 is provided on the first base body 2. The bonding section 3 is translucent. The bonding section 3 bonds the first base body 2 to the light emitting section 20 and the second base body 4. The bonding section 3 is formed by e.g. curing a transparent adhesive.

The refractive index of the first base body 2, the refractive index of the bonding section 3, and the refractive index of the translucent section 26 can be made comparable.

If these refractive indices are made comparable, reflection at the interface between the first base body 2 and the bonding section 3 and at the interface between the translucent section 26 and the bonding section 3 can be suppressed. This can increase the light extraction efficiency.

Furthermore, the refractive index of the first base body 2, the refractive index of the bonding section 3, the refractive index of the second base body 4, and the refractive index of the translucent section 26 can be made comparable. This can further increase the light extraction efficiency.

The second base body 4 is provided on the bonding section 3, and embeds the light emitting section 20. That is, the light emitting section 20 is embedded inside the second base body 4. This can suppress tilting of the light emitting section 20 with respect to the surface 2a of the first base body 2.

The end surface 31a1 of the first pillar section 31a and the end surface 31b1 of the second pillar section 31b are exposed from the surface 4a of the second base body 4. The light emitting surface 26b of the translucent section 26 is exposed from the other surface 4b of the second base body 4. In the case where the second base body 4 is translucent, the light emitting surface 26b of the translucent section 26 may not be exposed from the surface 4b of the second base body 4.

The second base body 4 can be translucent. If the second base body 4 is translucent, the light emitted from the side surface side of the light emitting section 20 can be transmitted. This can suppress narrowing of the directivity of the light emitting section 20. As a result, the uniformity of the intensity of the light emitted from the light emitting device 1 can be improved. Furthermore, in the case where the light emitting device 1 is a surface emitting module used in e.g. an illumination device, the second base body 4 being translucent can suppress illumination unevenness.

The second base body 4 being translucent can be formed from e.g. a translucent material illustrated in the first base body 2.

Alternatively, the second base body 4 can be made reflective. If the second base body 4 is reflective, the light emitted from the side surface side of the light emitting section 20 can be reflected. This can narrow the directivity of the light emitting section 20. That is, mixing of light between the adjacent light emitting sections 20 can be suppressed. For instance, in the case where the light emitting device 1 is used in e.g. a device for displaying characters and images, the second base body 4 being reflective can make the display clear.

The second base body 4 being reflective can be formed from e.g. a white resin, a resin added with a reflective material such as metal, or a metal.

Thus, the material of the second base body 4 can be appropriately selected depending on the purpose and the like of the light emitting device 1. Thus, the directivity of the light emitting section 20 can be changed.

The wiring section 5 is provided on the surface 4a of the base section 10. The wiring section 5 is electrically connected to the end surface 31a1 and the end surface 31b1. That is, the wiring section 5 is connected to the light emitting element 22. The wiring section 5 can be connected to e.g. an external power supply, not shown. The wiring section 5 can be formed from a metal such as copper, aluminum, and silver. The surface 5a of the wiring section 5 can be provided with an oxidation resistant film, not shown. The oxidation resistant film, not shown, can be e.g. a nickel/gold stacked film. The wiring section 5 can be provided so that the light emitting sections 20 are series connected. Alternatively, the wiring section 5 can be provided so that the light emitting sections 20 are parallel connected.

In the example illustrated in FIG. 1B, a plurality of light emitting sections 20 are provided. The wiring section 5 is provided for each region between the light emitting sections 20. The wiring section 5 is provided so as to cover the region between the light emitting sections 20. The wiring sections 5 provided between the light emitting sections 20 are provided on the same plane. The wiring sections 5 provided on the same plane facilitate mounting the light emitting device 1 on another apparatus.

The surface 5a of the wiring section 5 is exposed. The surface 5a of the wiring section 5 being exposed can improve the dissipation performance of heat from the light emitting sections 20. Furthermore, the wiring section 5 is planar. The wiring section 5 being planar can further improve the dissipation performance of heat from the light emitting sections 20. Furthermore, this facilitates providing e.g. a heat dissipation fin 6 on the wiring section 5.

The cross-sectional area of the end surface 31a1 and the end surface 31b1 is small. Thus, in typical mounting, solder having a small cross-sectional area is interposed between the end surface 31a1, 31b1 and the wiring section. This increases heat resistance in this portion.

In contrast, in this embodiment, the end surface 31a1 and the end surface 31b1 are directly connected to the wiring section 5. Thus, solder having a small cross-sectional area is not interposed between the end surface 31a1, 31b1 and the wiring section 5. This can suppress the increase of heat resistance.

The first pillar section 31a, the second pillar section 31b, and the second sealing section 32b of the light emitting section 20 can be omitted. In the case where the first pillar section 31a, the second pillar section 31b, and the second sealing section 32b are not provided, the wiring section 5 may be electrically connected to the first electrode wiring 30a and the second electrode wiring 30b. Omitting the first pillar section 31a, the second pillar section 31b, and the second sealing section 32b can further reduce the heat resistance.

The light emitting device 1 illustrated in FIGS. 1A and 1B includes a plurality of light emitting sections 20. However, the number of light emitting sections 20 may be one. The layout and the like of the light emitting sections 20 are not limited to those illustrated in FIGS. 1A and 1B, but can be appropriately modified.

Furthermore, after producing a light emitting device including a plurality of light emitting sections 20, this can be cut to obtain a light emitting device including a desired number of light emitting sections 20.

In the light emitting device 1 according to this embodiment, formation of the base section 10, provision of the light emitting section 20 on the base section 10, and wiring of the light emitting section 20, for instance, can be performed in a sequence of process steps. This can improve the volume productivity.

Furthermore, the light emitting section 20 is embedded inside the second base body 4. This can suppress tilting of the light emitting section 20 with respect to the first base body 2 in the volume production of the light emitting device 1.

Furthermore, the wiring section 5 having a prescribed configuration is provided. Thus, the heat dissipation performance can also be improved.

[Second Embodiment]

Figure 3A:
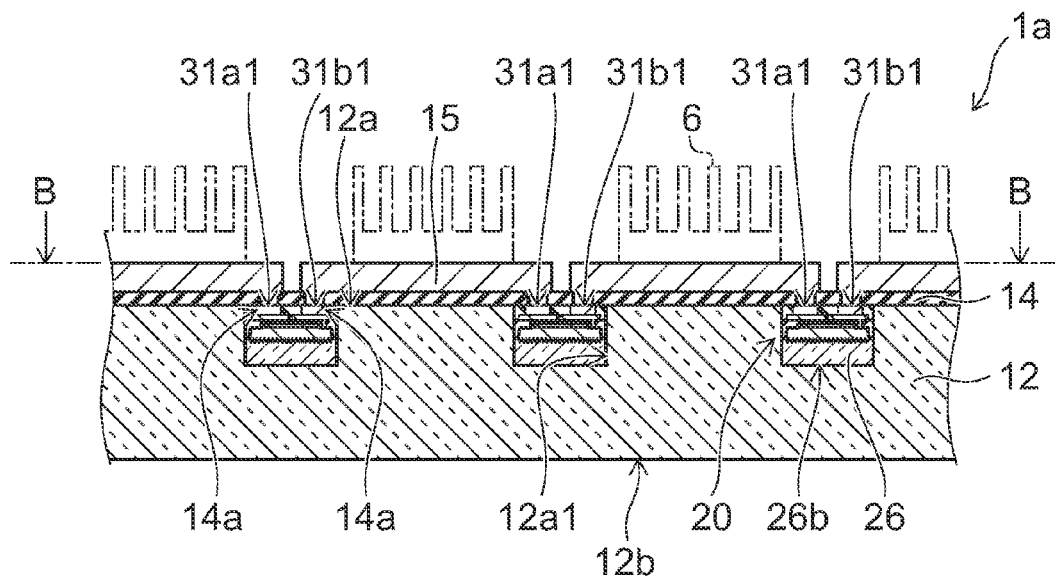
FIGS. 3A and 3B are schematic views illustrating a light emitting device according to a second embodiment.
Figure 3B:
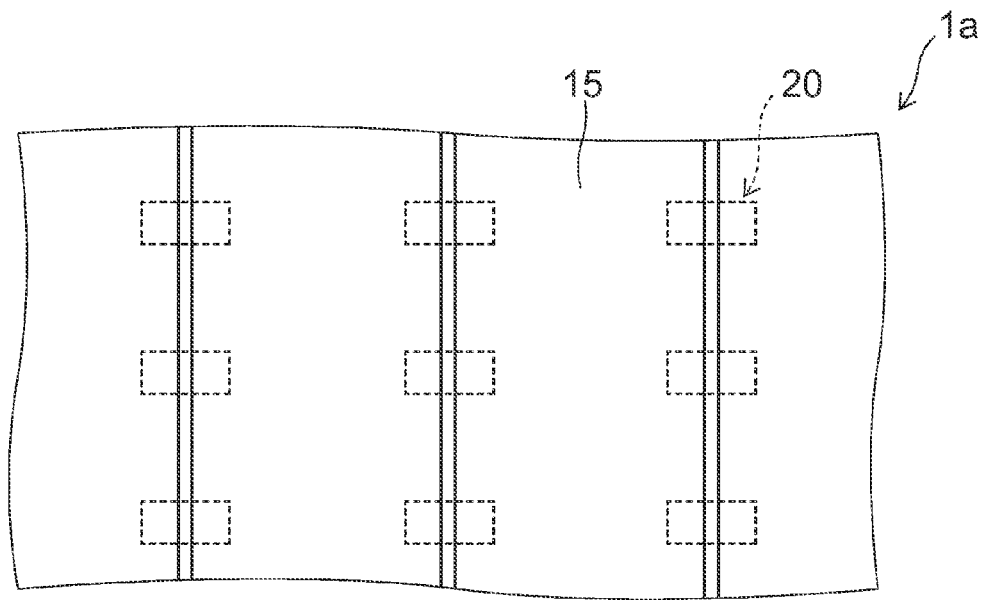

FIGS. 3A and 3B are schematic views illustrating a light emitting device according to a second embodiment. Here, FIG. 3A is a schematic sectional view illustrating the light emitting device. FIG. 3B is an arrow view taken along line B-B in FIG. 3A.

As shown in FIGS. 3A and 3B, the light emitting device 1a includes a light emitting section 20, a base section 12 (corresponding to an example of the first base section), a reflecting section 14, and a wiring section 15 (corresponding to an example of the first wiring section).

The base section 12 is plate-like and translucent. The surface 12b of the base section 12 can be provided with an uneven portion, not shown, or a diffusing layer (e.g., a layer made of resin containing fine particles), not shown, for diffusing the emitted light.

The end surface 31a1 of the first pillar section 31a and the end surface 31b1 of the second pillar section 31b are exposed from the surface 12a (corresponding to an example of the first surface) of the base section 12.

The base section 12 can be formed from e.g. a translucent material. The translucent material is e.g. an organic material such as translucent resin, or an inorganic material such as glass. For instance, the translucent resin can be made similar to that illustrated in the translucent section 26.

The refractive index of the base section 12 and the refractive index of the translucent section 26 can be made comparable. If these refractive indices are made comparable, reflection at the interface between the base section 12 and the translucent section 26 can be suppressed. This can increase the light extraction efficiency.

In one surface 12a of the base section 12, a recess 12a1 is provided. The light emitting section 20 is provided inside the recess 12a1. That is, the light emitting section 20 is embedded inside the base section 12. This can suppress tilting of the light emitting section 20 with respect to the other surface 12b of the base section 12.

Furthermore, the light emitted from the side surface side of the light emitting section 20 can be transmitted inside the base section 12. This can suppress narrowing of the directivity of the light emitting section 20. As a result, the uniformity of the intensity of the light emitted from the light emitting device la can be improved. Furthermore, in the case where the light emitting device la is a surface emitting module used in e.g. an illumination device, illumination unevenness can be suppressed.

The reflecting section 14 is provided between the base section 12 and the wiring section 15. The reflecting section 14 is provided so as to cover the surface 12a of the base section 12. The reflecting section 14 is reflective. The reflecting section 14 can be formed from e.g. a white resin such as white resist, or titanium oxide ($TiO_2$). If the reflecting section 14 is patterned so as to avoid short circuit in the light emitting section 20, the reflecting section 14 can be formed from a metal such as aluminum. The reflecting section 14 is provided with holes 14a for exposing the end surface 31a1 and the end surface 31b1.

The reflecting section 14 can be a reflecting section for reflecting light of a prescribed wavelength. For instance, the reflecting section 14 can be a reflecting section for reflecting e.g. red or blue light.

The wiring section 15 is provided on the reflecting section 14. In this case, the wiring section 15 is electrically connected to the end surface 31a1 and the end surface 31b1 via the holes 14a. That is, the wiring section 15 is connected to the light emitting element 22. The material, configuration and the like of the wiring section 15 can be made similar to the material, configuration and the like of the wiring section 5 described above.

The light emitting device la according to this embodiment can improve the volume productivity like the light emitting device 1 described above.

Furthermore, the light emitting section 20 is embedded inside the base section 12. This can suppress tilting of the light emitting section 20 with respect to the base section 12 in the volume production of the light emitting device 1a.

Furthermore, the wiring section 15 having a prescribed configuration is provided. Thus, the heat dissipation performance can also be improved.

[Third Embodiment]

Figure 4A:
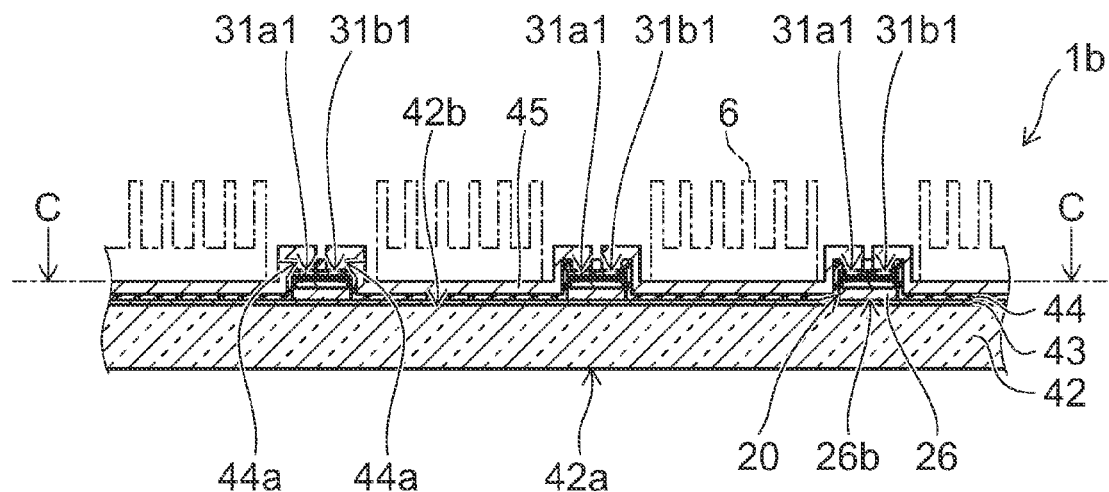
FIGS. 4A and 4B are schematic views illustrating a light emitting device according to a third embodiment.
Figure 4B:
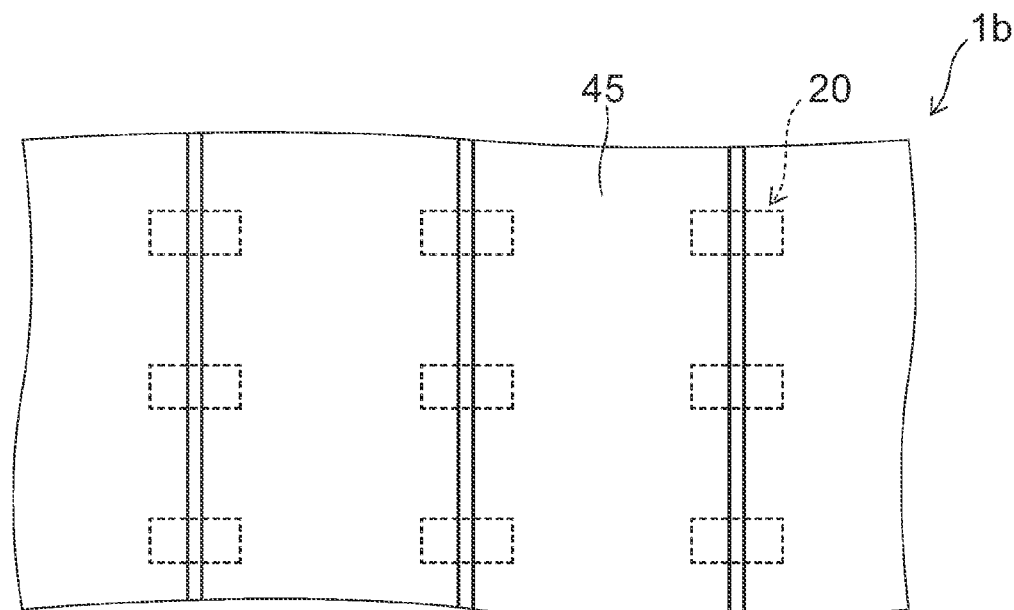

FIGS. 4A and 4B are schematic views illustrating a light emitting device according to a third embodiment. Here, FIG. 4A is a schematic sectional view illustrating the light emitting device. FIG. 4B is an arrow view taken along line C-C in FIG. 4A.

As shown in FIGS. 4A and 4B, the light emitting device 1b includes a light emitting section 20, a base section 42 (corresponding to an example of the second base section), a bonding section 43 (corresponding to an example of the second bonding section), a reflecting section 44 (corresponding to an example of the second reflecting section), and a wiring section 45 (corresponding to an example of the second wiring section).

The light emitting section 20 including a light emitting element 22 is provided on the surface 42b (corresponding to an example of the second surface) side of the base section 42.

The base section 42 is plate-like and translucent. The surface 42a of the base section 42 can be provided with an uneven portion, not shown, or a diffusing layer (e.g., a layer made of resin containing fine particles), not shown, for diffusing the emitted light.

The base section 42 can be formed from e.g. a translucent material. The translucent material is e.g. an organic material such as translucent resin, or an inorganic material such as glass. For instance, the translucent resin can be made similar to that illustrated in the translucent section 26.

The bonding section 43 is translucent. The bonding section 43 is provided so as to cover the surface 42b of the base section 42. The light emitting surface 26b of the translucent section 26 is bonded to the base section 42 via the bonding section 43. That is, the light emitting section 20 is bonded to the base section 42 via the bonding section 43. The bonding section 43 is formed by e.g. curing a transparent adhesive.

The bonding section 43 only needs to be provided at least between the base section 42 and the light emitting section 20.

The refractive index of the base section 42, the refractive index of the bonding section 43, and the refractive index of the translucent section 26 can be made comparable. If these refractive indices are made comparable, reflection at the interface between the base section 42 and the bonding section 43 and at the interface between the translucent section 26 and the bonding section 43 can be suppressed. This can increase the light extraction efficiency.

The reflecting section 44 is provided so as to cover the surface 42b side of the base section 42. The reflecting section 44 is reflective. If the reflecting section 44 is provided, the light emitted from the side surface side of the light emitting section 20 can be reflected. This can narrow the directivity of the light emitting section 20. That is, mixing of light between the adjacent light emitting sections 20 can be suppressed. For instance, in the case where the light emitting device lb is used in e.g. a device for displaying characters and images, the reflecting section 44 thus provided can make the display clear.

The reflecting section 44 can be formed from e.g. a white resin such as white resist, a resin added with a reflective material such as metal, or a metal. In the case where the wiring section 45 is formed from a highly reflective material (e.g., aluminum), the reflecting section 44 can be omitted.

The reflecting section 44 is provided with holes 44a for exposing the end surface 31a1 and the end surface 31b1.

The wiring section 45 is provided on the reflecting section 44. In this case, the wiring section 45 is electrically connected to the end surface 31a1 and the end surface 31b1 via the holes 44a. That is, the wiring section 45 is connected to the light emitting element 22. The material, configuration and the like of the wiring section 45 can be made similar to the material, configuration and the like of the wiring section 5 described above.

In the example illustrated in FIGS. 4A and 4B, a plurality of light emitting sections 20 are provided. The wiring section 45 is planar. The wiring section 45 is provided for each region between the light emitting sections 20 so as to cover the region between the light emitting sections 20.

The light emitting device 1b according to this embodiment can improve the volume productivity like the light emitting device 1 described above.

Furthermore, the wiring section 45 having a prescribed configuration is provided. Thus, the heat dissipation performance can also be improved.

The light emitting section 20 illustrated above corresponds to the case of the light emitting section 20 based on WLP (wafer-level package).

However, the embodiments are not limited to the light emitting section 20 based on WLP. For instance, the embodiments are also applicable to a light emitting section in which the light emitting element 22 is flip-chip connected to a substrate including a wiring layer.

Next, a method for manufacturing a light emitting device is illustrated.

[Fourth Embodiment]

Figure 5A:
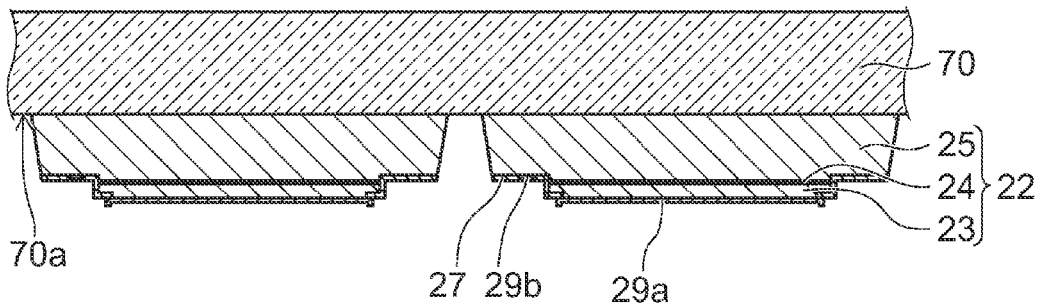
FIGS. 5A to 5C are schematic process sectional views illustrating the steps from forming a light emitting element 22 to forming a sealing section 32 in the method for manufacturing a light emitting device.
Figure 5B:
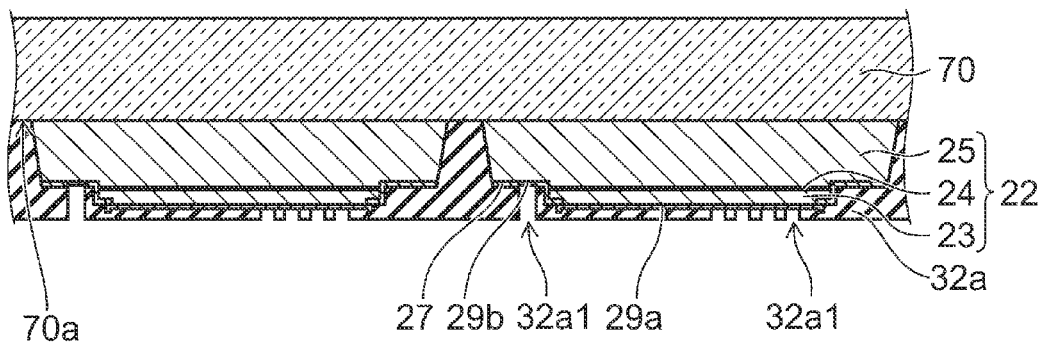
Figure 5C:
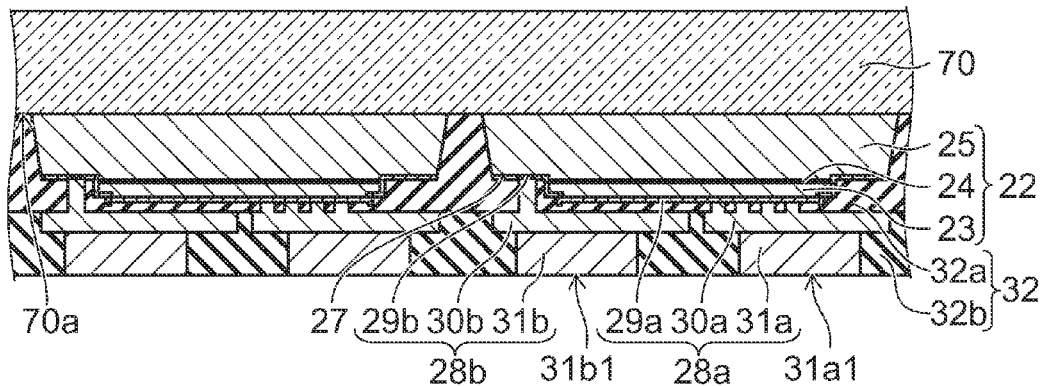

FIGS. 5A to 5C are schematic process sectional views illustrating the steps from forming a light emitting element 22 to forming a sealing section 32 in the method for manufacturing a light emitting device.

First, as shown in FIG. 5A, on the surface 70a of a substrate 70 made of e.g. sapphire, a second semiconductor layer 25, a light emitting layer 24, and a first semiconductor layer 23 are formed. That is, a light emitting element 22 including a light emitting surface 22a is formed. Then, an insulating section 27 is formed on the surface of the second semiconductor layer 25 and the first semiconductor layer 23. A first seed section 29a is formed on the surface of the first semiconductor layer 23. A second seed section 29b is formed on the surface of the second semiconductor layer 25.

These components can be formed by using known techniques such as film formation, photolithography, and dry etching.

Next, as shown in FIG. 5B, a first sealing section 32a is formed on the entire surface on the surface 70a side. An opening 32a1 is formed so as to expose part of the first seed section 29a and the second seed section 29b.

Next, as shown in FIG. 5C, by using a known film formation technique, a film constituting a first wiring section 30a, a second wiring section 30b, a first pillar section 31a, and a second pillar section 31b is formed. By using the photolithography technique and dry etching technique, a first wiring section 30a, a second wiring section 30b, a first pillar section 31a, and a second pillar section 31b are successively formed. Then, by using a technique such as spin coating, a film constituting a second sealing section 32b is formed on the entire surface on the surface 70a side. The film is planarized so as to expose the end surface 31a1 of the first pillar section 31a and the end surface 31b1 of the second pillar section 31b. Thus, a second sealing section 32b is formed.

Furthermore, by using a technique such as lift-off, the substrate 70 is removed.

Figure 6A:
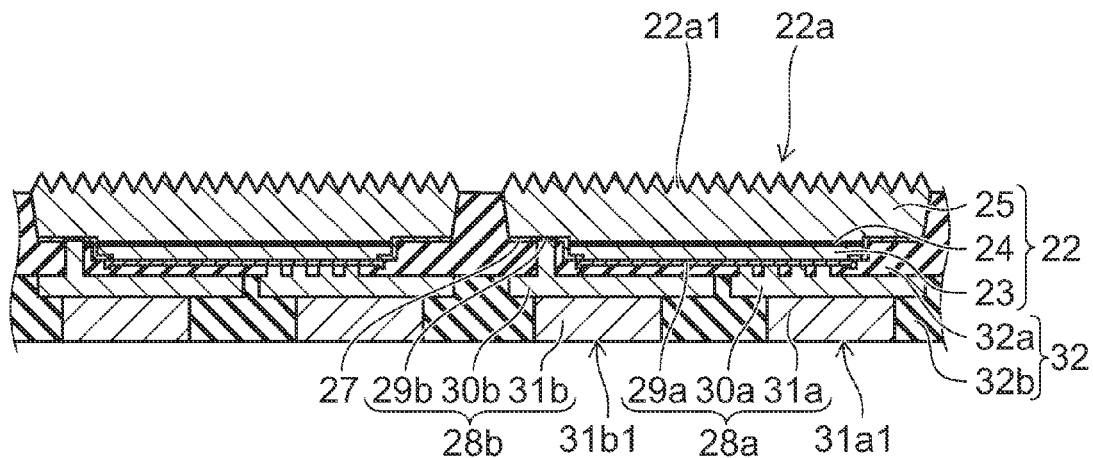
FIGS. 6A and 6B are schematic process sectional views illustrating the steps from forming an uneven portion 22a1 to forming a translucent section 26 in the method for manufacturing a light emitting device.
Figure 6B:
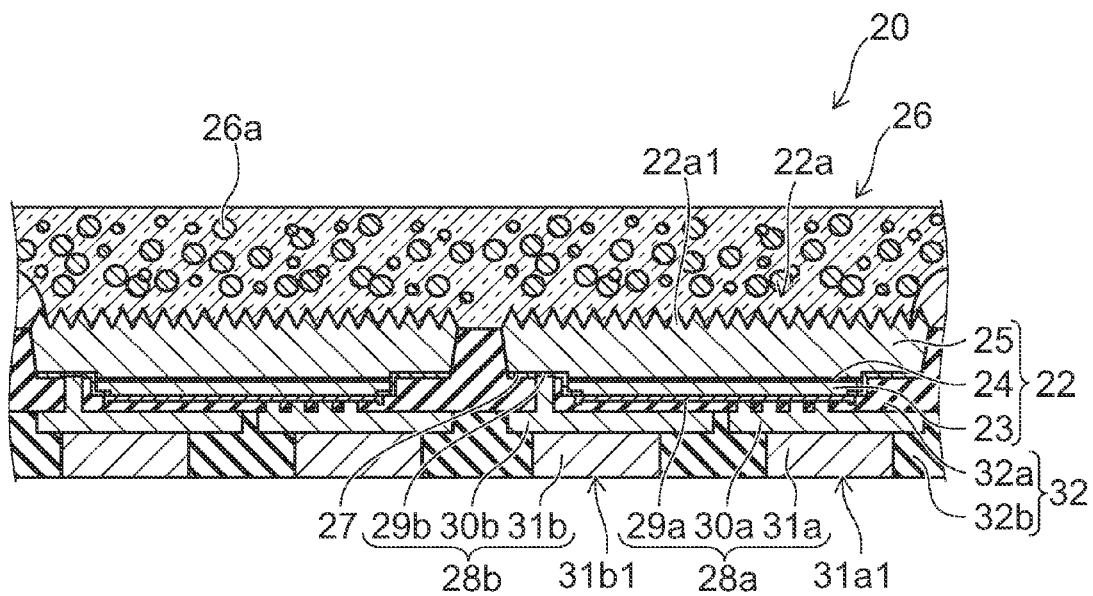

FIGS. 6A and 6B are schematic process sectional views illustrating the steps from forming an uneven portion 22a1 to forming a translucent section 26 in the method for manufacturing a light emitting device.

First, as shown in FIG. 6A, an uneven portion 22a1 is formed on the surface 22a of the light emitting element 22.

In the case where the second semiconductor layer 25 is formed from e.g. GaN, the uneven portion 22a1 can be formed by using the we etching technique. For instance, the surface 22a can be we etched with an aqueous solution of tetramethylammonium hydroxide ($(CH_3)_4NOH$) (TMH) or an aqueous solution of potassium hydroxide (KOH) to form an uneven portion 22a1 based on the crystal structure.

Alternatively, an uneven portion 22a1 can be formed on the surface 22a by using the photolithography technique and dry etching technique.

Next, as shown in FIG. 6B, a translucent section 26 is formed so as to cover the entire surface on the surface 22a side of the light emitting element 22.

The translucent section 26 can be formed by using a technique such as vacuum screen printing and molding.

For instance, by using a technique such as vacuum screen printing and molding, a translucent resin including a phosphor 26a is applied to the surface 22a side of the light emitting element 22, and cured to form a translucent section 26.

As described above, a plurality of light emitting sections 20 can be collectively formed.

Next, the light emitting sections 20 are singulated.

Figure 7:
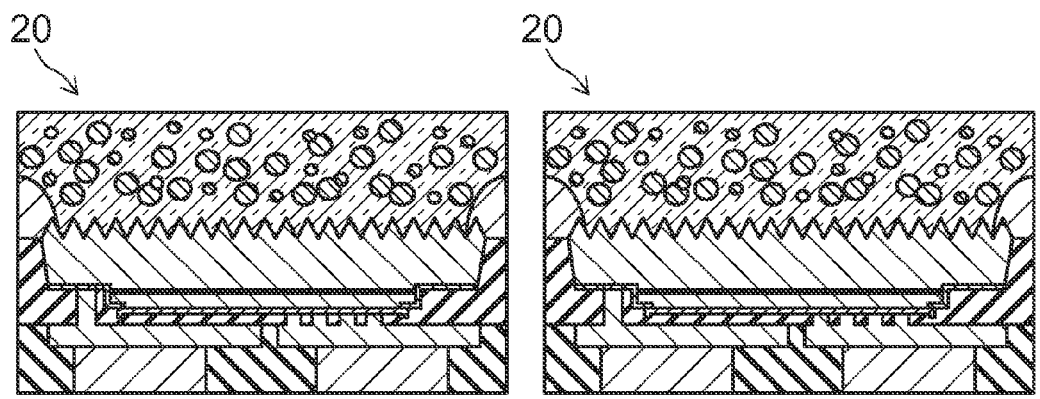
FIG. 7 is a schematic process sectional view illustrating the singulation of the light emitting section 20.

FIG. 7 is a schematic process sectional view illustrating the singulation of the light emitting section 20.

As shown in FIG. 7, by cutting between the light emitting sections 20, the light emitting sections 20 are singulated. Examples of the cutting method can include mechanical cutting using e.g. a diamond blade, cutting based on laser irradiation, and cutting with high-pressure water.

As described above, the light emitting section 20 including the light emitting element 22 can be formed.

Figure 8A:
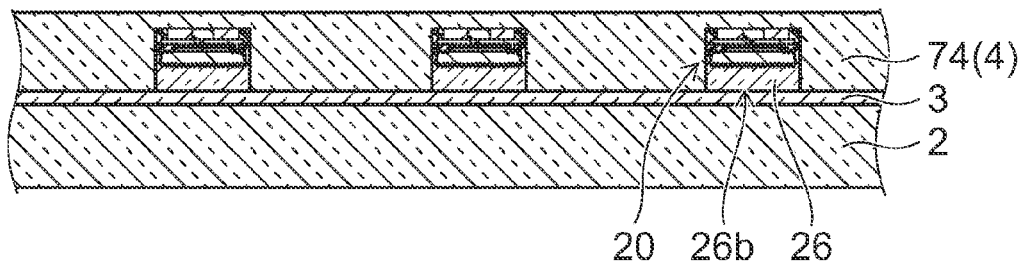
FIGS. 8A to 8C are schematic process sectional views illustrating a method for manufacturing the light emitting device 1 illustrated in FIGS. 1A and 1B.
Figure 8B:
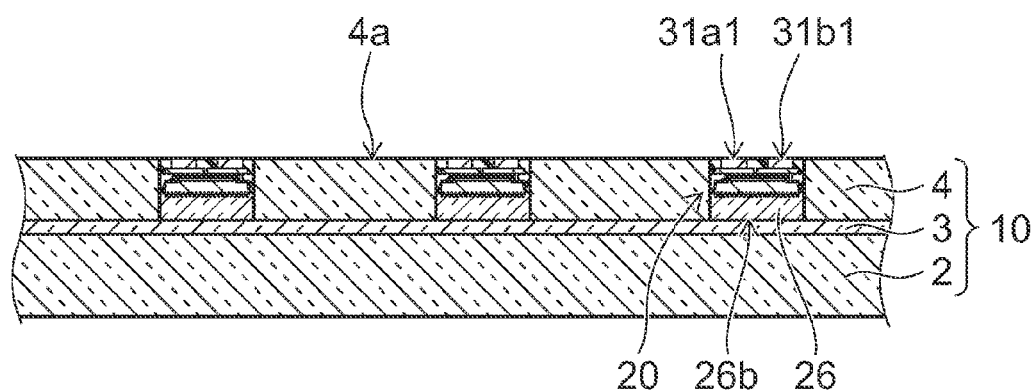
Figure 8C:
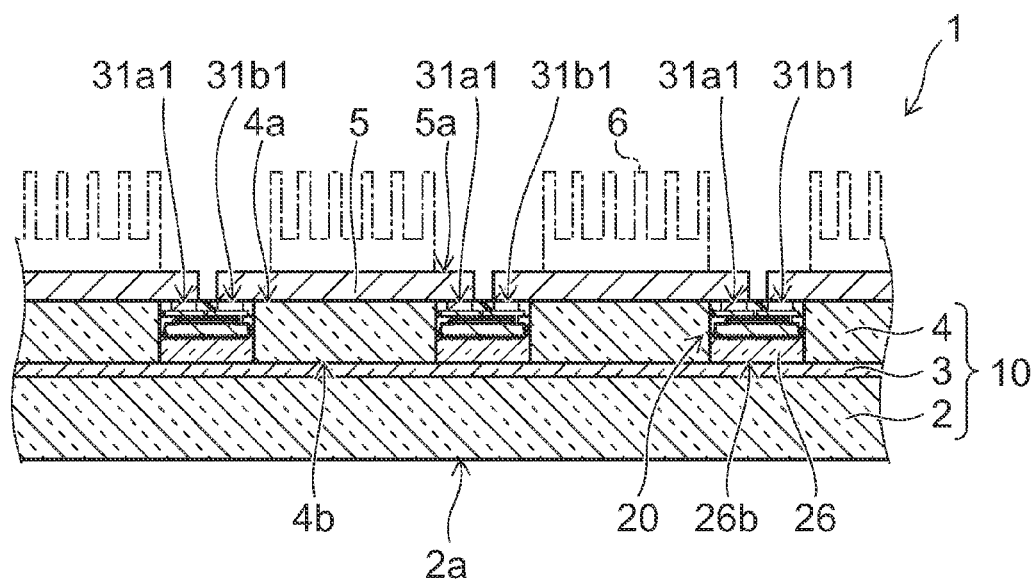

FIGS. 8A to 8C are schematic process sectional views illustrating a method for manufacturing the light emitting device 1 illustrated in FIGS. 1A and 1B.

First, as shown in FIG. 8A, a bonding section 3 is formed on a first base body 2. A light emitting section 20 is provided on the bonding section 3. Then, a film 74 constituting a second base body 4 is formed so as to cover the bonding section 3 and the light emitting section 20.

For instance, by using a technique such as vacuum screen printing and molding, a transparent adhesive is applied onto the first base body 2 and turned into a semi-cured state. Then, a light emitting section 20 is provided on the semi-cured transparent adhesive, which is then cured. In this case, the cured transparent adhesive constitutes a bonding section 3. The transparent adhesive can be semi-cured and cured by e.g. heat treatment. The light emitting section 20 can be provided by using e.g. the die mounting technique.

The film 74 constituting a second base body 4 can be formed by e.g. applying a prescribed resin using a technique such as curtain coating, and curing the resin. The applied resin can be cured by e.g. heat treatment.

Next, as shown in FIG. 8B, the surface of the film 74 is planarized to expose the light emitting section 20. That is, the planarization is performed until the end surface 31a1 and the end surface 31b1 are exposed. By such planarization, a second base body 4 is formed. The planarization can be performed by e.g. grinding.

As described above, a light emitting section 20 is embedded on the surface 4a side of the base section 10.

Next, as shown in FIG. 8C, a wiring section 5 connected to the light emitting element 22 is formed on the surface 4a of the base section 10.

Here, the wiring section 5 having the configuration described above is formed.

For instance, a seed metal layer, not shown, having a prescribed shape is formed on the surface 4a by a technique such as evaporation. Then, by using the electrolytic plating technique, a wiring section 5 is formed on the seed metal layer. Furthermore, by using the electrolytic plating technique, an oxidation resistant film made of e.g. nickel/gold can also be formed on the surface of the wiring section 5.

Furthermore, as necessary, a heat dissipation fin 6 and the like are provided on the wiring section 5.

Thus, a light emitting device including a plurality of light emitting sections 20 can be manufactured. Furthermore, by cutting a light emitting device including a plurality of light emitting sections 20, a light emitting device including a desired number of light emitting sections 20 can be obtained. Examples of the cutting method can include mechanical cutting using e.g. a diamond blade, cutting based on laser irradiation, and cutting with high-pressure water.

Figure 9A:
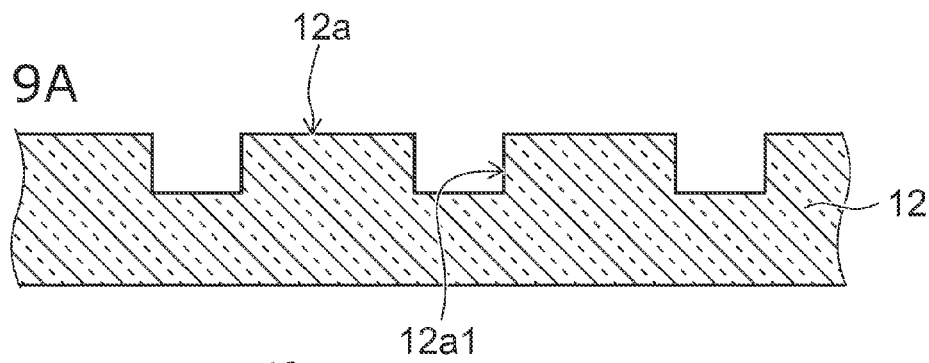
FIGS. 9A to 9D are schematic process sectional views illustrating a method for manufacturing the light emitting device 1a illustrated in FIGS. 3A and 3B.

FIGS. 9A to 9D are schematic process sectional views illustrating a method for manufacturing the light emitting device 1a illustrated in FIGS. 3A and 3B. First, as shown in FIG. 9A, a recess 12a1 is formed on the surface 12a side of the base section 12. The recess 12a1 can be formed by e.g. a technique such as grinding and we etching.

Figure 9B:
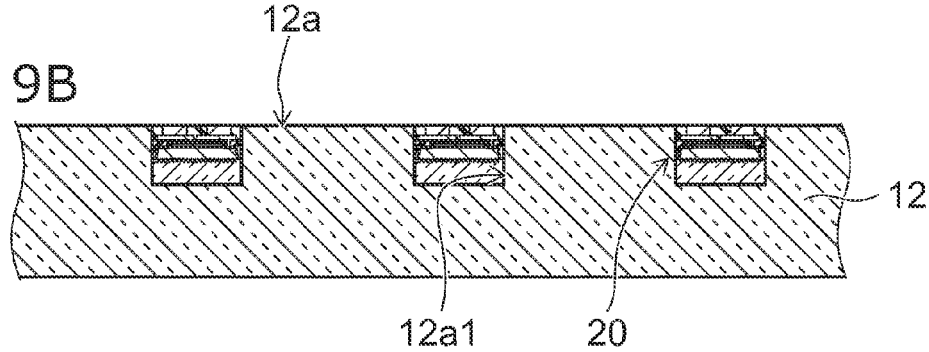

Next, as shown in FIG. 9B, a light emitting section 20 is provided inside the recess 12a1. The light emitting section 20 can be provided by using e.g. the die mounting technique. In the singulation illustrated in FIG. 7, a plurality of light emitting sections 20 may be provided on an expansion sheet. In this case, by stretching the expansion sheet, the spacing between the light emitting sections 20 can be matched with the spacing between the recesses 12a1. If the spacing between the light emitting sections 20 can be matched with the spacing between the recesses 12a1, a plurality of light emitting sections 20 can be provided at once.

Figure 9C:
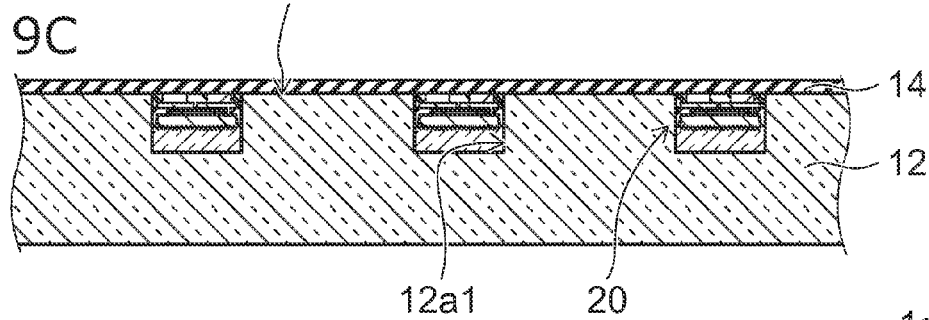

Next, as shown in FIG. 9C, a reflecting section 14 is formed so as to cover the surface 12a of the base section 12 and the light emitting section 20. The reflecting section 14 can be formed by e.g. applying white resist using a technique such as curtain coating, and curing the resist. The white resist can be cured by e.g. ultraviolet irradiation.

Figure 9D:
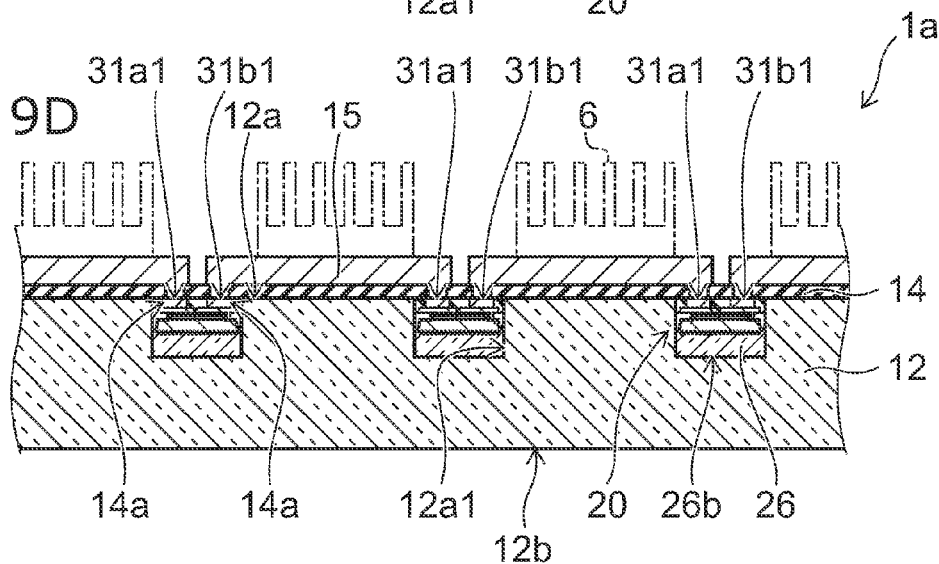

Next, as shown in FIG. 9D, holes 14a are formed in the reflecting section 14. A wiring section 15 is formed on the reflecting section 14. For instance, in the case where the reflecting section 14 is formed from white resist, holes 14a can be formed by using the photolithography technique. The formation of the wiring section 15 can be made similar to the formation of the wiring section 5 described above.

Furthermore, as necessary, a heat dissipation fin 6 and the like are provided on the wiring section 15.

Thus, a light emitting device including a plurality of light emitting sections 20 can be manufactured. Furthermore, by cutting a light emitting device including a plurality of light emitting sections 20, a light emitting device including a desired number of light emitting sections 20 can be obtained. Examples of the cutting method can include mechanical cutting using e.g. a diamond blade, cutting based on laser irradiation, and cutting with high-pressure water.

FIGS. 10A to 10E are schematic process sectional views illustrating a method for manufacturing the light emitting device 1b illustrated in FIGS. 4A and 4B.

Figure 10A:
FIGS. 10A to 10E are schematic process sectional views illustrating a method for manufacturing the light emitting device 1b illustrated in FIGS. 4A and 4B.

First, as shown in FIG. 10A, a film 75 constituting a bonding section 43 is formed on one surface of a base section 42.

For instance, by using a technique such as vacuum screen printing and molding, a transparent adhesive is applied onto the base section 42 and turned into a semi-cured state. Thus, the film 75 is formed.

Figure 10B:
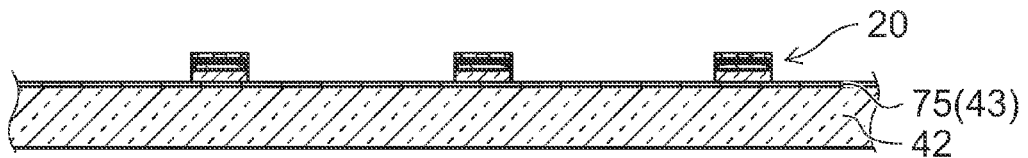

Next, as shown in FIG. 10B, a light emitting section 20 is provided on the film 75.

For instance, a light emitting section 20 is provided on the semi-cured film 75, which is then cured. In this case, the cured film 75 constitutes a bonding section 43. The transparent adhesive can be semi-cured and cured by e.g. heat treatment. The light emitting section 20 can be provided by using e.g. the die mounting technique.

Figure 10C:
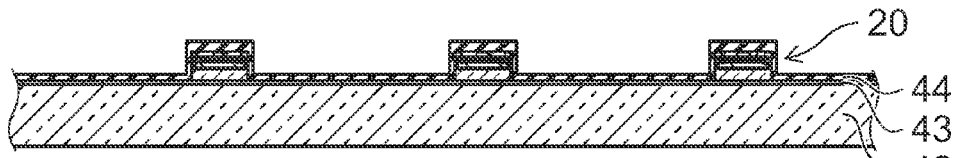

Next, as shown in FIG. 10C, a reflecting section 44 is formed so as to cover the bonding section 43 and the light emitting section 20.

For instance, the reflecting section 44 can be formed by e.g. applying white resist using a technique such as curtain coating, and curing the resist. The white resist can be cured by e.g. ultraviolet irradiation.

Figure 10D:
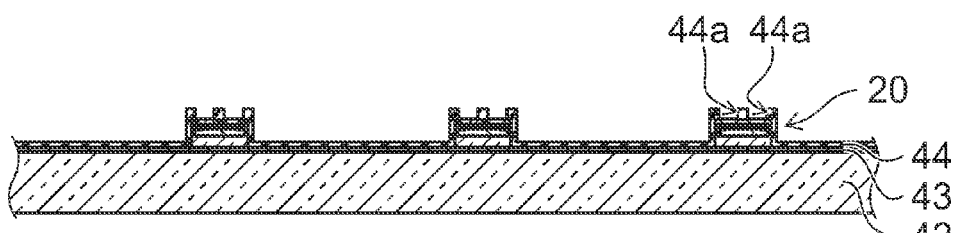

Next, as shown in FIG. 10D, holes 44a are formed in the reflecting section 44.

For instance, in the case where the reflecting section 44 is formed from white resist, holes 44a can be formed by using the photolithography technique.

Figure 10E:
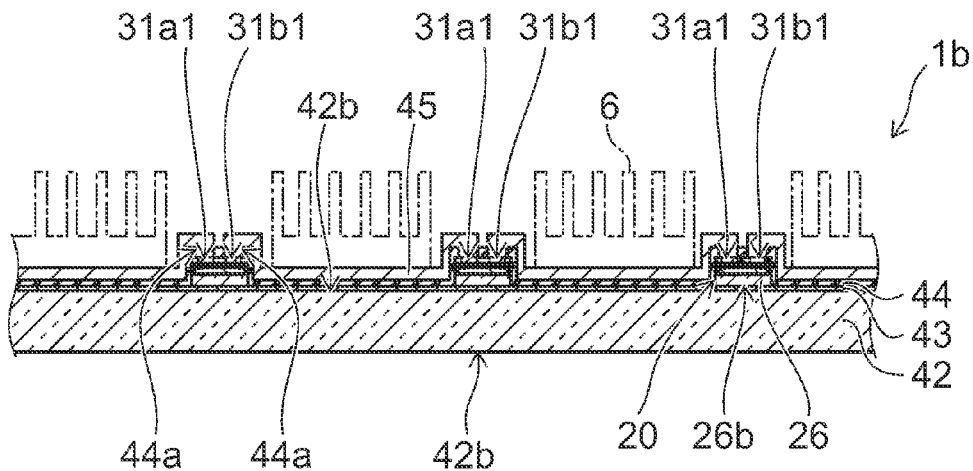

Next, as shown in FIG. 10E, a wiring section 45 is formed on the reflecting section 44.

The formation of the wiring section 45 can be made similar to the formation of the wiring section 5 described above.

Furthermore, as necessary, a heat dissipation fin 6 and the like are provided on the wiring section 45.

Thus, a light emitting device including a plurality of light emitting sections 20 can be manufactured. Furthermore, by cutting a light emitting device including a plurality of light emitting sections 20, a light emitting device including a desired number of light emitting sections 20 can be obtained. Examples of the cutting method can include mechanical cutting using e.g. a diamond blade, cutting based on laser irradiation, and cutting with high-pressure water.

In the manufacturing method according to this embodiment, the end surface 31a1 and the end surface 31b1 can be directly connected to the wiring section 5. Thus, solder having a small cross-sectional area is not interposed between the end surface 31a1, 31b1 and the wiring section 5. This can suppress the increase of heat resistance in this portion. Furthermore, there is no need to perform solder reflow. Thus, there are no such problems as tilting of the light emitting section 20 in solder reflow.

Furthermore, the light emission efficiency of the light emitting section 20 thus formed can be increased.

Moreover, the manufacturing method as described above can improve the volume productivity.

Furthermore, a light emitting section 20 as small as the size of the light emitting element 22 can be easily manufactured. Furthermore, there is no need to use mounting members such as a lead frame and ceramic substrate. Thus, wiring, sealing and the like can be performed on the wafer level. Furthermore, inspection can be performed on the wafer level. Thus, the productivity in the manufacturing process can be improved. As a result, cost reduction is facilitated.

The embodiments illustrated above can realize a light emitting device capable of improving the volume productivity and a method for manufacturing the same.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A light emitting device comprising:
a first base section;
a plurality of light emitting sections embedded on a first surface side of the first base section, the plurality of light emitting sections being provided side by side in a first direction and a second direction perpendicular to the first direction, wherein:
  each of the light emitting sections includes a light emitting element, a first electrode wiring, a second electrode wiring, a first pillar section, a second pillar section, and a sealing section;
  the first pillar section is connected to the light emitting element via the first electrode wiring;
  the second pillar section is connected to the light emitting element via the second electrode wiring;
  the sealing section is provided so as to cover the first electrode wiring, the first pillar section, the second electrode wiring, and the second pillar section; and
  an end surface of the first pillar section and an end surface of the second pillar section are exposed from the sealing section; and
a first wiring section provided on the first surface of the first base section,
wherein:
the first wiring section is connected to and covers an entirety of a top planar region between the first pillar section of one of the light emitting sections and the second pillar section of an adjacent one of the light emitting sections in the first direction;
the first wiring section is connected to and covers an entirety of a top planar region between the first pillar section of one of the light emitting sections and the first pillar section of an adjacent one of the light emitting sections in the second direction;
the first wiring section is connected to and covers an entirety of a top planar region between the second pillar section of one of the light emitting sections and the second pillar section of an adjacent one of the light emitting sections in the second direction; and
the first wiring section is planar.

2. The device according to claim 1, wherein each of the light emitting sections is embedded with a light emitting surface thereof directed to an opposite side from the first surface side.

3. The device according to claim 1, wherein the first base section includes:
a first base body;
a first bonding section provided on the first base body; and
a second base body provided on the first bonding section and embedding the light emitting sections therein.

4. The device according to claim 3, wherein the first base body, the first bonding section, and the second base body are translucent.

5. The device according to claim 3, wherein the second base body is reflective.

6. The device according to claim 3, wherein the first base body and the first bonding section are translucent.

7. The device according to claim 3, wherein:
each of the light emitting sections includes a translucent section provided on a light emitting surface of the light emitting element thereof, and
a refractive index of the translucent section, a refractive index of the first base body, and a refractive index of the first bonding section are equal.

8. The device according to claim 3, wherein:
each of the light emitting sections includes a translucent section provided on a light emitting surface of the light emitting element thereof, and
a refractive index of the translucent section, a refractive index of the first base body, a refractive index of the first bonding section, and a refractive index of the second base body are equal.

9. The device according to claim 3, wherein:
the first base body is translucent and has a plurality of recesses,
the first bonding section is translucent,
the second base body is translucent,
the plurality of light emitting sections are directly embedded into the plurality of recesses, and
a refractive index of the first base body, a refractive index of the first bonding section, and a refractive index of the second base body are equal.

10. The device according to claim 1, wherein:
each of the light emitting sections includes a translucent section provided on a light emitting surface of the light emitting element thereof, and
a refractive index of the translucent section and a refractive index of the first base section are equal.

11. The device according to claim 1, further comprising:
a reflecting section between the first base section and the first wiring section, the reflecting section being reflective.

12. The device according to claim 1, wherein a plurality of the first wiring sections are provided, the plurality of the first wiring sections being provided on a same plane.

13. The device according to claim 1, wherein a surface on an opposite side from a light emitting surface of each light emitting section is provided on a same plane as the first surface.

14. The device according to claim 1, wherein:
the first base section is translucent, the first base section has a plurality of recesses on the first surface side, and a refractive index of a bottom surface of each of the plurality of recesses and a refractive index of a side surface of each of the plurality of recesses are equal, and
the plurality of light emitting sections are directly embedded into the plurality of recesses.

15. A light emitting device comprising:
a first base section;
a plurality of light emitting sections provided on a first surface side of the first base section, the plurality of light emitting sections being provided side by side in a first direction and a second direction perpendicular to the first direction, wherein:
  each of the light emitting sections includes a light emitting element, a first electrode wiring, a second electrode wiring, a first pillar section, a second pillar section, and a sealing section;
  the first pillar section is connected to the light emitting element via the first electrode wiring;
  the second pillar section is connected to the light emitting element via the second electrode wiring;

the sealing section is provided so as to cover the first electrode wiring, the first pillar section, the second electrode wiring, and the second pillar section; and an end surface of the first pillar section and an end surface of the second pillar section are exposed from the sealing section;

a first bonding section provided between the first base section and the light emitting sections;

a first reflecting section provided so as to cover the first surface side of the first base section, the first reflecting section being reflective; and a first wiring section provided on the first reflecting section, wherein:

the first wiring section is connected to and covers an entirety of a top planar region between the first pillar section of one of the light emitting sections and the second pillar section of an adjacent one of the light emitting sections in the first direction;

the first wiring section is connected to and covers an entirety of a to planar region between the first pillar section of one of the light emitting sections and the first pillar section of an adjacent one of the light emitting sections in the second direction;

the first wiring section is connected to and covers an entirety of a to planar region between the second pillar section of one of the light emitting sections and the second pillar section of an adjacent one of the light emitting sections in the second direction; and the first wiring section is planar.

16. The device according to claim 15, wherein:

each of the light emitting sections includes a translucent section provided on a light emitting surface of the light emitting element thereof, and a refractive index of the translucent section, a refractive index of the first base section, and a refractive index of the first bonding section are equal.

17. The device according to claim 15, wherein:

the first base section is translucent, the first bonding section is translucent, and a refractive index of the first base section and a refractive index of the first bonding section are equal.

* * * * *